United States Patent [19]

Rice

[11] Patent Number: 4,625,388
[45] Date of Patent: * Dec. 2, 1986

[54] METHOD OF FABRICATING MESA MOSFET USING OVERHANG MASK AND RESULTING STRUCTURE

[75] Inventor: Edward J. Rice, Los Gatos, Calif.

[73] Assignee: Acrian, Inc., San Jose, Calif.

[*] Notice: The portion of the term of this patent subsequent to Dec. 13, 2000 has been disclaimed.

[21] Appl. No.: 558,923

[22] Filed: Dec. 7, 1983

Related U.S. Application Data

[63] Continuation-in-part of Ser. No. 371,599, Apr. 26, 1982, Pat. No. 4,419,811.

[51] Int. Cl.[4] .............................................. H01L 21/22
[52] U.S. Cl. ......................................... 29/571; 29/578; 29/579; 29/580; 148/187; 357/55; 357/23.4
[58] Field of Search ................. 29/571, 578, 579, 580; 148/187; 357/23, 55

[56] References Cited

U.S. PATENT DOCUMENTS

| 3,761,785 | 9/1973 | Prunioux | 29/579 |
| 3,823,352 | 7/1974 | Runiaux | 29/579 |
| 3,851,379 | 12/1974 | Gutknecht et al. | 29/579 |
| 4,200,968 | 6/1980 | Schroeder | 29/571 |
| 4,419,811 | 12/1983 | Rice | 29/579 |
| 4,505,022 | 3/1985 | Briere | 29/580 |

Primary Examiner—Brian E. Hearn
Assistant Examiner—Hunter L. Auyang
Attorney, Agent, or Firm—Flehr, Hohbach, Test, Albritton & Herbert

[57] ABSTRACT

A mesa structure field effect transistor includes a semiconductor body with at least one mesa formed on a major surface and an insulating layer on the mesa and overhanging the mesa. Doped regions in the side walls of the mesa define the channel region and source of the transistor, and the semiconductor body defines and drain region. Preferential etching techniques are employed in forming the mesas and the overhanging insulator. The overhanging insulator is employed as a shadow mask in fabricating the transistor.

13 Claims, 22 Drawing Figures

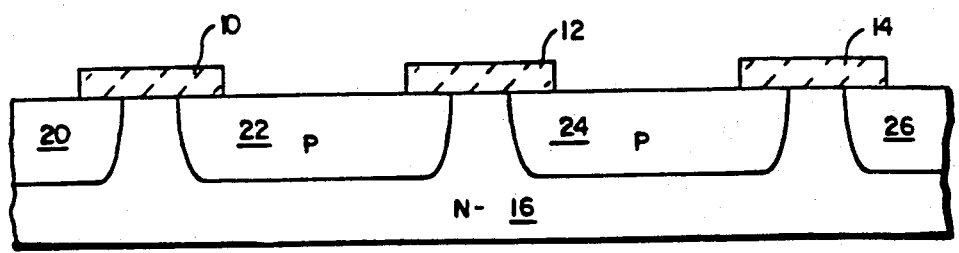
FIG.—1A
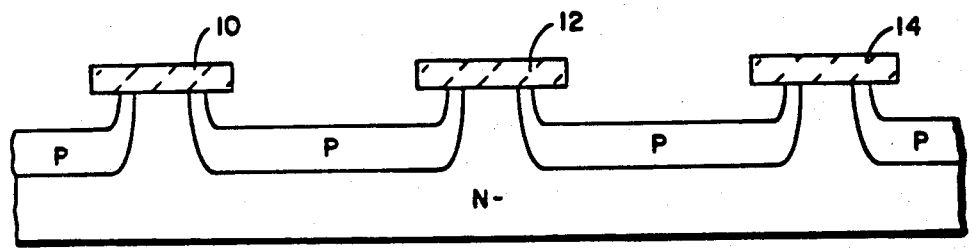
FIG.—1B
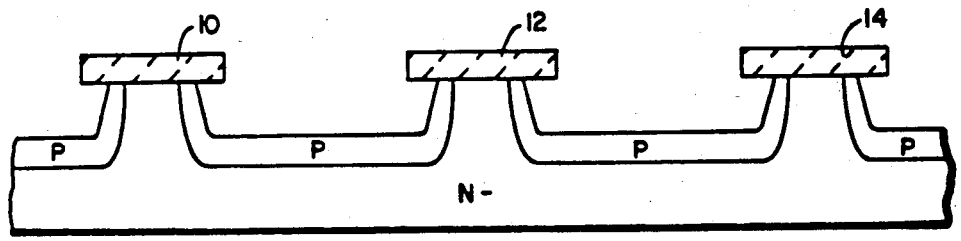
FIG.—1C
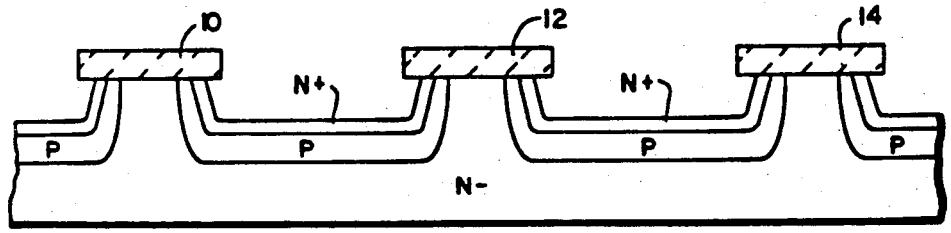
FIG.—1D
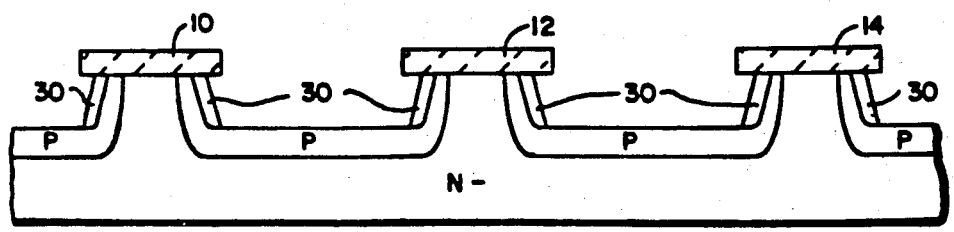
FIG.—1E

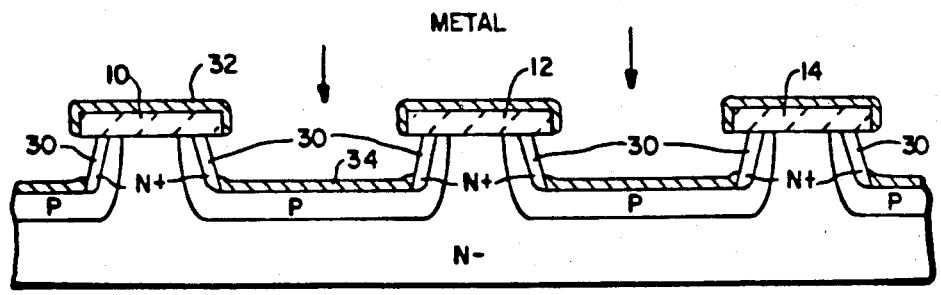
FIG.—1F
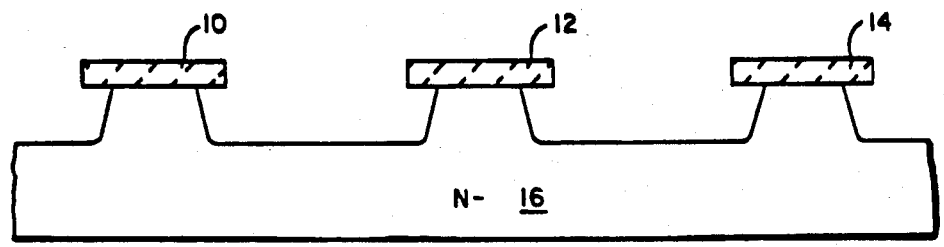
FIG.—2A
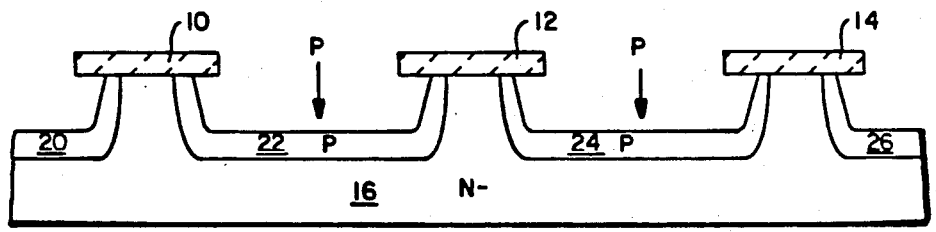
FIG.—2B
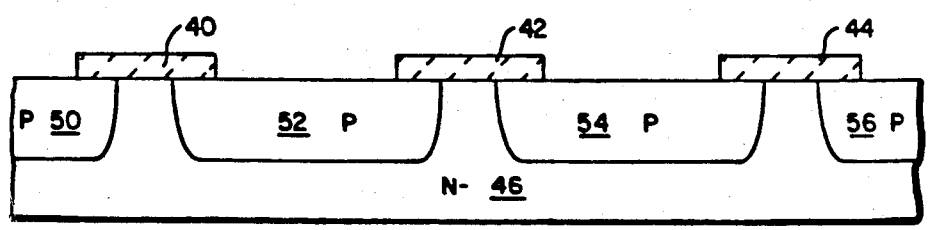
FIG.—3A

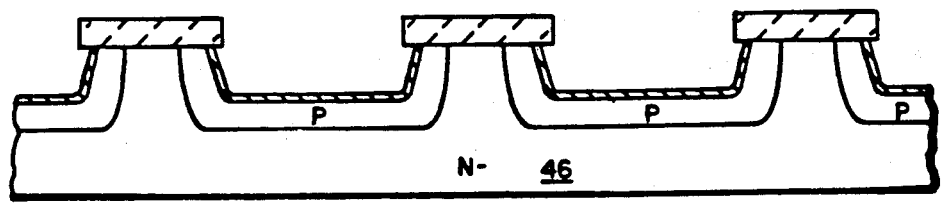
FIG.—3B
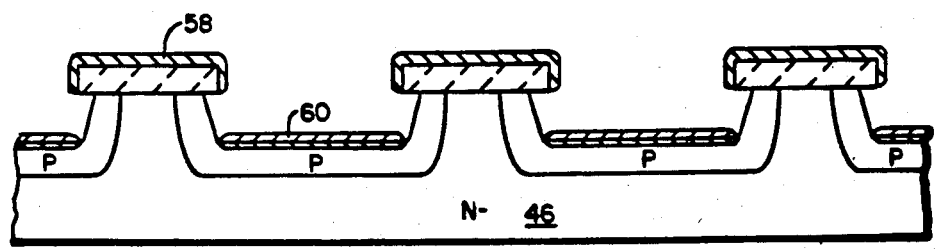
FIG.—3C
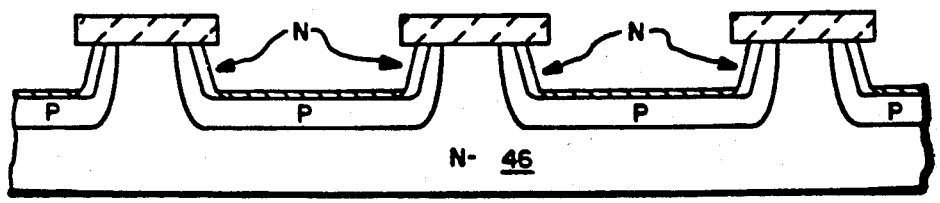
FIG.—3D
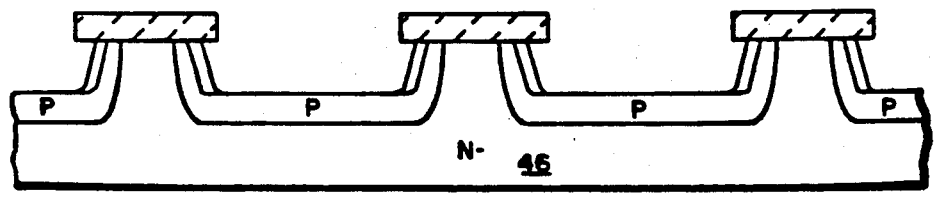
FIG.—3E

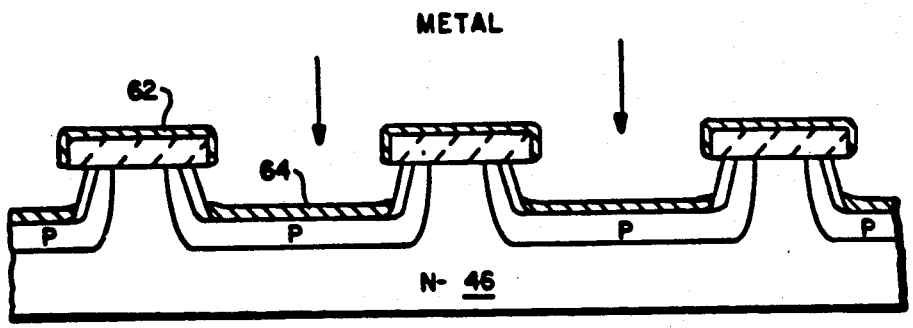
FIG.—3F
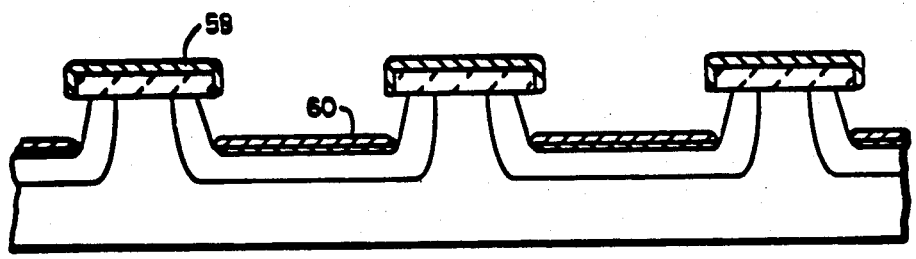
FIG.—4A
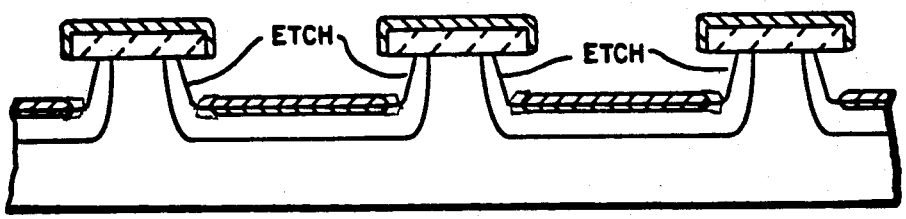
FIG.—4B
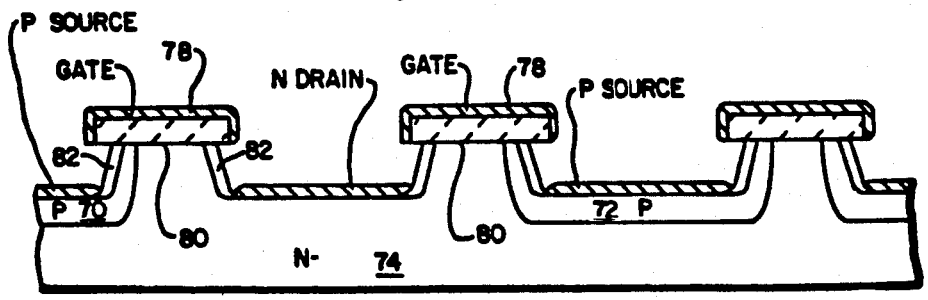
FIG.—5

METHOD OF FABRICATING MESA MOSFET USING OVERHANG MASK AND RESULTING STRUCTURE

This application is a continuation-in-part of U.S. application Ser. No. 371,599, filed Apr. 26, 1982 by the same inventor, now U.S. Pat. No. 4,419,811.

This invention relates generally to semiconductor devices and processes, and more particularly the invention relates to metal oxide silicon field effect transistor (MOSFET) structures and methods of fabricating same.

Vertical and horizontal MOSFET structures are well known in the art. The vertical structure is particularly advantageous in high frequency applications because of small channel lengths which can be obtained. The use of isotropic and anisotropic (preferential) etching techniques, along with the use of the oxide overhang masking, are well known, also.

The present invention is directed to a method of making novel MOSFET structures using a unique combination of known processing techniques. Briefly, mesa structures having oxide overhangs are provided with the overhanging portion functioning as a mask in the processing steps. A vertical MOSFET formed in the mesa structure has a short, controlled channel region which is advantageous for high frequency applications.

The invention and objects and features thereof will be more readily apparent form the following detailed description and appended claims when taken with the drawing, in which:

FIGS. 1A-1F are section views of a portion of a semiconductor body illustrating the steps in fabricating a MOSFET structure in accordance with one embodiment of the invention.

FIGS. 2A and 2B are section views of a portion of a semi-conductor body illustrating alternative steps in the process illustrated in FIGS. 1A-1F.

FIGS. 3A-3F are section views of a portion of a semiconductor body illustrating the steps in fabricating a MOSFET structure in accordance with another embodiment of the invention.

FIGS. 4A and 4B are section views of a portion of a semiconductor body illustrating alternative steps in the process illustrated in FIGS. 3A-3F.

FIG. 5 is a section view of a portion of a semiconductor body illustrating a MOSFET structure in accordance with another embodiment of the invention.

Figure 6A:
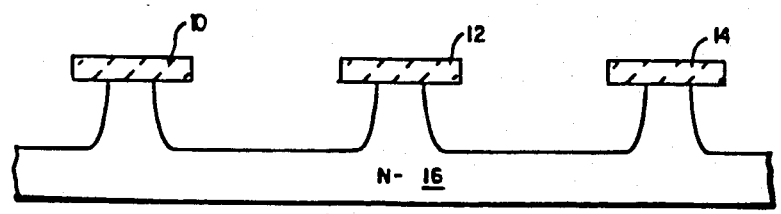
FIGS. 6A-6E are section views of a portion of a semiconductor body illustrating the steps in fabrication a MOSFET structure in accordance with another embodiment of the invention.
Figure 6B:
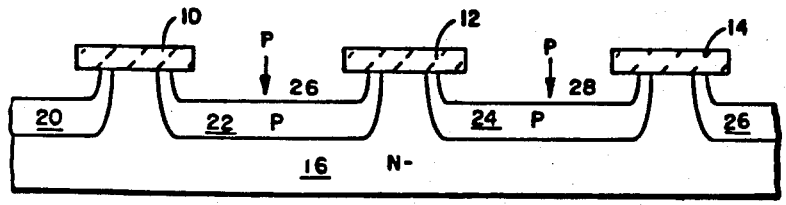

Referring now to the drawings, FIGS. 1A-1F are section views of a portion of a portion of a semiconductor body illustrating the steps in fabricating a MOSFET structure in accordance with one embodiment of the invention. In the process descriptions herein the steps in fabricating an N channel enhancement mode device will be described. However, it will be appreciated that the process steps can be used to make other field effect transistor structures including P-Channel and depletion mode structures. In FIG. 1A a plurality of insulating layers 10,12 and 14 are formed on a major surface of an N-silicon body 16. The insulating layer may comprise a silicon oxide layer or silicon oxide and silicon nitride layers. The surface has a 1-0-0 crystal structure which allows anisotropic or preferential etching as will be described. The body 16 may comprise a semiconductor substrate or an epitaxial layer on a silicon substrate. The insulating layers 10,12, 14 are utilized as a mask in diffusing a P-type dopant such as boron into the major surface of the body 16 thereby forming the p doped regions 20,22,24, and 26.

Thereafter, as illustrated in FIG. 1B the exposed surface of body 16 between the insulating layers 10,12, 14 is etched by an isotropic etch such as a mixture of hydroflouric and nitric acid. The isotropic etch undercuts the insulating layers 10, 12 14 and forms mesa structures thereunder.

Next, an anisotropic etchant such as potassium hydroxide is applied which preferentially attacks the 1-0-0 plane of the silicon surface thereby deepening the etched portion of the p regions 20-26 and forming generally planar inclined side walls on the mesas which are defined by the 1-1-1 crystalline plane of the silicon material, as shown in FIG. 1C.

Following the preferential etch, a shallow N+ diffusion is made through the silicon oxide layers 10-14 into the surface of the P regions 20-26 as illustrated in FIG. 1D. Thereafter, a preferential etchant is again applied to the exposed semiconductor material thereby removing the shallow N+ region in the 1-0-0 plane but leaving the N+ regions 30 in the 1-1-1 crystallographic planes of the side walls of the mesas intact as shown in FIG. 1E.

Finally, as illustrated in FIG. 1F, a conductive metal such as aluminum is deposited on the surface of the silicon body. The insulating layers 10-14 function as shadow masks and interrupt the metal layers 32 deposited on top of the insulating layers from the metal layers 34 formed on the surface of the P regions 20-26. The completed structure comprises the N− body 16 as a common drain region, the N+ regions 30 as a source region, and the P doped regions 20-26 immediately beneath the insulating layers 10-14 comprise the channel regions of the devices. Metal layers 32 are gate contacts, and metal layers 34 are common source-channel region contacts. Importantly, the length of the channel region is short and well defined by the N+ diffusion into the side wall of the mesa. Further, the metal layers 34 short the source and channel regions very close to the channel thereby suppressing any parasitic NPN transistor function. Minimization of capacitance is very important to high frequency device fabrication.

An alternative embodiment of the process described in FIGS. 1A-1F is illustrated in FIGS. 2A and 2B in which the isotropic and anisotropic etch of the semiconductor body 16 is performed as shown in FIG. 2A prior to the diffusion of P dopant to form the regions 20,22, 24 and 26 as shown in FIG. 2B.

FIGS. 3A-3F are section views of a semiconductor body illustrating steps in fabricating a device in accordance with another embodiment of the invention. Again, as shown in FIG. 3A insulating layer 40,42, and 44 are formed on a 1-0-0 major surface of an N−. semiconductor body 46, and P doped regions 50,52, 54 and 56 are formed in the major surface of the body 46.

Thereafter, as illustrated in FIG. 3B the P regions 50-56 are isotropically etched thereby undercutting the insulating layers 40-44, and exposed surface of the etched regions is oxidized as shown in FIG. 3B.

Next, as shown in FIG. 3C a layer 58 and 60 of masking material such as aluminum are deposited on the major surface of the body 46 with the overhanging insulation providing a mask which shields the masking material from the side walls of the mesas. The exposed silicon oxide on the side walls is then removed by an etchant and the masking material is then removed.

Thereafter, as shown in FIG. 3D N type regions are diffused into the exposed side walls of the mesas, with the oxide on the bottom masking that area from the N+ diffusion. Subsequently, the remaining silicon oxide layers on the surfaces of the P regions 50-56 are removed by etching (which also removes a small portion of the thicker silicon oxide layers 40-44) as illustrated in FIG. 3E.

Finally, as shown in FIG. 3F conductive metallization is again deposited on the major surface of the body 46 with the metal layers 62 on the surfaces of the insulating layers 40-44 being separated from the metal layers 64 on the surfaces of the P regions 50-56 by the shadow mask provided by the overhanging insulating layers. The structure as shown in FIG. 3F is the same as the structure shown in FIG. 1F.

FIGS. 4A and 4B illustrate additional steps which can be performed between the steps 3C and 3D. FIG. 4A illustrates the structure of FIG. 3C with the masking material layer 58 on the top of the insulating layers 40-44 and the masking material layer 60 on top of the P regions 50-56. As shown in FIG. 4B an isotropic etch is applied to the exposed side walls of the mesa beneath the insulating layers 40-44 thereby further reducing the thickness of the channel regions defined by the P type regions underneath the insulating layers. The masking material layers can be removed prior to or after the isotropic etch. This process variation has the advantage in that the final surface concentration of the p channel region can be controlled by monitoring the sheet resistance of test wafers as the side walls of the mesas are isotropically etched. Thereafter, the N type regions are formed in the exposed mesa side walls as illustrated in FIG. 3D.

The resulting structures in the described processes are vertical MOSFETs as illustrated in FIGS. 1F and 3F. However, the process steps can be varied slightly to form a lateral MOSFET as illustrated in FIG. 5. In this embodiment it will be noted that the diffused P regions 70 and 72 formed in the N-semiconductor body 74 are separated by an etched region having no P region. Metal layer 76 is a drain contact to the N+ drain 83, the N+ diffusion that forms the source contact 82 also forms the drain contact 83, the metal 78 on the insulating layers 80 form the gate contacts, and the metal layers 82 are source-channel region contacts. The gate contact 78 controls channel regions in the underlying P-regions 70,72. Thus, the current flow is lateral from the source contact 82 through the induced channels in P-regions 70,72 through the drain regions 80 to the drain contact 83.

A further alternative process comprises the sequence of steps shown in FIG. 6A et seq. Although the process is explained with reference to the sequence of figures labeled 6, the process essentially comprises a combination of the sequences illustrated in FIGS. 2A and 2B, and FIGS. 4A and 4B.

FIG. 6A shows a body of semiconductor material 16 having patterned, overhanging oxide layers 10,12, and 14. This patterning is achieved by laying down a layer of oxide, patterning the oxide, and etching it with an isotropic etch which undercuts the insulating layers and forms the mesa structures all as discussed with respect to FIGS. 1A and 1B.

Next, a diffusion of P dopant is carried out to form the regions 20,22 and 24 which extend across the base of the grooves 26, 28 and up the sides of the grooves to reach the overhanging insulating layers. In the course of this diffusion, a thin layer of silicon oxide is formed due to the heat necessary to carry out the diffusion.

Figure 6C:
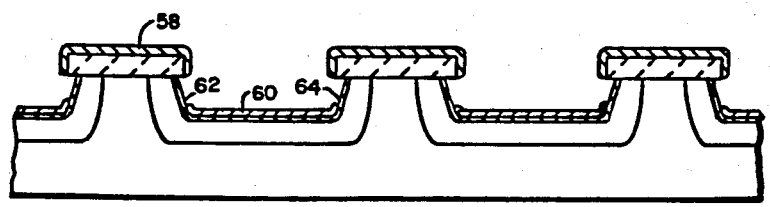
Figure 6D:
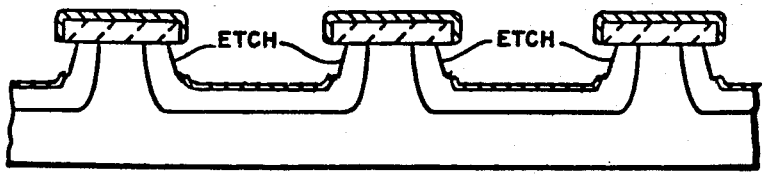
Figure 6E:
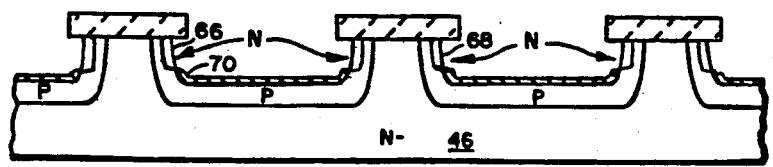

As a next step, a layer of a masking material 58,60 is evaporated onto the surface of the material as shown in FIG. 6C. The result is two separated metal layers, one covering the surface of the silicon oxide atop the mesa, the other extending across the base of the groove and partially up the sides of the groove between the mesas. This masking material used as a mask to remove the thin layer of silicon oxide to the extent that it comes down the side walls which define the mesa. After removing the masking material, the remaining oxide can be used as a mask to do a lateral silicon etch. The advantages of doing this lateral etch are discussed with respect to the description of FIGS. 4A and 4B. Following this etch, N type regions 66, 68 are formed in the side walls of the mesas. It has been found that an advantage of this sequence is that it moves the junction between the N− type diffused region as close to the top of the mesa as possible. Having completed this diffusion step, the remaining oxide on the base of the groove is now removed, and the final metal layer is put in place. As already demonstrated in FIG. 5, either lateral or vertical transistors may be formed by a slight variation in process step sequence, and the addition of appropriate contacts, i.e. a vertical transistor will need a contact to the bottom of the substrate to function as the drain.

In illustrative embodiments the N− body is an epitaxial layer having a dopant concentration of $10^{14}$–$10^{16}$ phosphorous atoms per cc. The P- region has a surface concentration of $6 \times 10^{16}$ boron atoms per cc, and the N+ regions have a dopant concentration of $3 \times 10^{19}$ phosphorus atoms per cc. The isotropic etch and the anisotropic etch each removed one to two microns of semiconductor material.

There has been described a MOSFET transistor structure in which the channel regions are narrow and closely controlled for enhanced operation characteristics. Further, the common contact to the source and channel regions is provided close to the induced channel thereby suppressing any parasitic bipolar transistor action. The shadow masks provided by the overhanging silicon oxide layers above the mesas interrupt the metal layers on top of the mesas (gate contacts) and the metal layers on the surface of the recessed etched regions (source and drain contacts).

While the invention has been described with reference to specified embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a field effect transistor in a body of semiconductor material of first conductivity type comprising the steps of
   (a) forming a plurality of spaced layers of insulating material on a major surface of said body,
   (b) removing portions of said body by chemical etching thereby forming mesa structures defined by side walls, with said spaced layers of insulating material overhanging said mesa side walls,
   (c) forming layers of opposite conductivity type in said major surface by introducing dopants into said etched portion of said major surface of said semiconductor body; thereafter silicon oxide layers are formed on said etched portions, (d) depositing masking material layers on said plurality of spaced layers and opposite conductivity layers on said etched surfaces, said spaced layers overhanging said mesas interrupting said masking material layer on said spaced layers from said masking material layers on said etched surface, (e) removing the insulating material on the side walls of said mesa not covered by said masking material layer under said overhanging spaced layers to expose the surfaces of said side walls, (f) removing said masking material layers, (g) diffusing a first conductivity type dopant into the exposed surfaces of said mesa side wall, (h) removing said insulating material layers from said etched regions.

2. A method as claimed in claim 1 wherein said masking material layer of steps (e) comprises metal.

3. A method as claimed in claim 1 wherein said first conductivity type deposit of step (g) comprises phosphorus.

4. A method as claimed in claim 1 further comprising the step of lateral etching of the side walls of said mesa exposed by said step (e).

5. In a method of fabricating a field effect transistor comprising a body of semiconductor material of first conductivity type, a mesa structure formed on one major surface of said body, an insulating layer on and overhanging said mesa, a first region of opposite conductivity type in said major surface including the side walls of said mesa, a second region of first conductivity type in the side wall portions of said first region, and a conductive metal formed on said insulating material layer of said mesa and a conductive layer on said major surface contacting said first and second regions, the steps prior to formation of said second region of first conductivity type in the side wall portions of said mesa comprising (a) forming a plurality of spaced layers of insulating material on a major surface of said body, (b) removing portions of said body by chemical etching thereby forming mesa structures defined by side walls, with said spaced layers of insulating material overhanging said mesa side walls, and (c) forming layers of opposite conductivity type in said major surface by introducing dopants into said etched portions of said major surface of said semiconductor body thereby oxidizing the etched surfaces of said semiconductor body to form thin silicon oxide layers on said etched portions in said mesa structures underneath said insulating layers.

6. A method of fabricating a field effect transistor in a body of semiconductor material of first conductivity type comprising the steps of (a) forming a plurality of spaced layers of silicon oxide insulating material on a major surface of said semiconductor body.

(b) removing portions of said semiconductor body by chemical etching thereby forming mesa structures defined by side walls with said spaced layers of silicon oxide overhanging said mesas, (c) doping at least on said etched region adjacent each mesa, including one of the side walls of said mesa, with dopant of said second conductivity type, (d) doping the side walls of each of said mesas with dopant of said first conductivity type, and (e) diffusing a first conductivity type dopant into the exposed surfaces of said mesa side walls to form junctions.

7. A method as claimed in claim 6 wherein a conductive metal layer on said first surface is extended to contact the doped regions of first and second conductivity type.

8. A method as claimed in claim 7 wherein said doping step (c) forms a thin oxide over said doped surface, the steps thereafter and before step (d), comprising (f) depositing a removable masking material onto at least the bottom portion of said etched surface but excluding a portion of said side wall underlying said silicon oxide layer, as well as onto said silicon oxide layer, to define an opening for a source region of said transistor;

(g) using said removable masking material as a mask to remove a portion of said thin oxide covering the source region and (h) using the remaining portion of said thin oxide as a mask to laterally etch the side walls of said mesa to more clearly define the region of said side wall doping to define said source region.

9. A method as claimed in claim 8 wherein the junction at the laterally etched surface extends between said doped region of second conductivity type and said silicon oxide overhang on said mesa.

10. A method as claimed in claim 9 wherein both of said etched regions, including both of said side walls of said mesa, are doped with material of said second conductivity type.

11. A method as claimed in claim 10 wherein said source region is limited so as to not extend below the side wall of said mesa.

12. A method as claimed in claim 11 wherein said first conductivity type is N-type material and said second conductivity type is P-type material.

13. A method as claimed in claim 12 wherein said insulating layer on said mesa is chosen from the group comprising silicon oxide or silicon oxide and silicon nitride.

* * * * *